United States Patent
Shim et al.

(10) Patent No.: US 8,159,252 B2
(45) Date of Patent: Apr. 17, 2012

(54) TEST HANDLER AND METHOD FOR OPERATING THE SAME FOR TESTING SEMICONDUCTOR DEVICES

(75) Inventors: Jae-Gyun Shim, Suwon-si (KR); Yun-Sung Na, Cheunan-si (KR); In-Gu Jeon, Suwon-si (KR); Tae-Hung Ku, Suwon-si (KR); Dong-Han Kim, Suwon-si (KR)

(73) Assignee: TechWing Co., Ltd., Hwaseung-si (KR)

( * ) Notice: Subject to any disclaimer, the term of this patent is extended or adjusted under 35 U.S.C. 154(b) by 325 days.

(21) Appl. No.: 12/097,398

(22) PCT Filed: Feb. 9, 2007

(86) PCT No.: PCT/KR2007/000731
§ 371 (c)(1),
(2), (4) Date: Jun. 13, 2008

(87) PCT Pub. No.: WO2007/091871
PCT Pub. Date: Aug. 16, 2007

(65) Prior Publication Data
US 2008/0298946 A1 Dec. 4, 2008

(30) Foreign Application Priority Data

Feb. 10, 2006 (KR) .................... 10-2006-0013054

(51) Int. Cl.
*G01R 31/20* (2006.01)
(52) U.S. Cl. ......... 324/757.04; 324/757.01; 324/750.22; 324/750.16; 257/48
(58) Field of Classification Search .......... 324/754–765, 324/158.1, 757.01, 757.04
See application file for complete search history.

(56) References Cited

U.S. PATENT DOCUMENTS

| | | | | |
|---|---|---|---|---|
| 6,333,858 | B1 * | 12/2001 | Yun et al. | 361/807 |
| 6,515,470 | B2 * | 2/2003 | Suzuki et al. | 324/158.1 |
| 6,522,125 | B2 * | 2/2003 | Sagawa | 324/158.1 |
| 6,594,887 | B1 * | 7/2003 | Okuda et al. | 29/739 |
| 6,653,853 | B1 * | 11/2003 | Cheng | 324/754 |
| 6,831,296 | B1 * | 12/2004 | Lee et al. | 257/48 |
| 6,891,341 | B2 * | 5/2005 | Cho | 318/34 |
| 6,903,567 | B2 | 6/2005 | Chung et al. | |
| 7,557,564 | B2 * | 7/2009 | Shim et al. | 324/158.1 |
| 7,841,071 | B2 * | 11/2010 | Jeserer | 29/739 |

FOREIGN PATENT DOCUMENTS

KR 10-2003-0040675 A 5/2003

\* cited by examiner

*Primary Examiner* — Richard Isla Rodas
(74) *Attorney, Agent, or Firm* — Jefferson IP Law, LLP

(57) ABSTRACT

A test handler and method for operating a test handler for testing semiconductor devices are provided. The test handler includes a test tray located on one side of an opening apparatus in which a plurality of inserts are arrayed, wherein each insert comprises at least one semiconductor device loaded thereon, at least one opening unit for opening inserts at one part of the one side of the test tray, and a position changing apparatus comprises a motor including a driving pulley for moving at least one opening unit along a contact surface of the test tray such that the at least one opening unit changes positions on the test tray and is located at another part of the one side of the test tray in order to open inserts at the other part of the one side of the test tray.

3 Claims, 6 Drawing Sheets

[Fig 1]
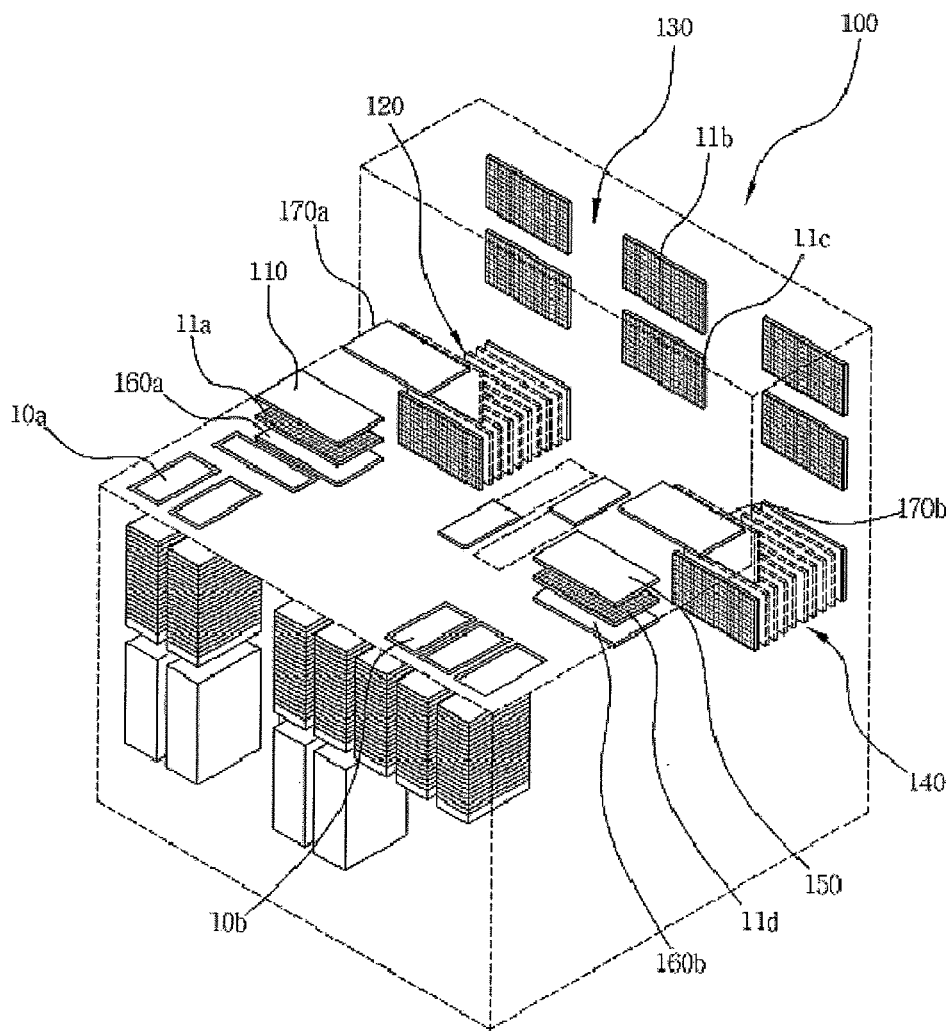
CONVENTIONAL ART

[Fig 2]
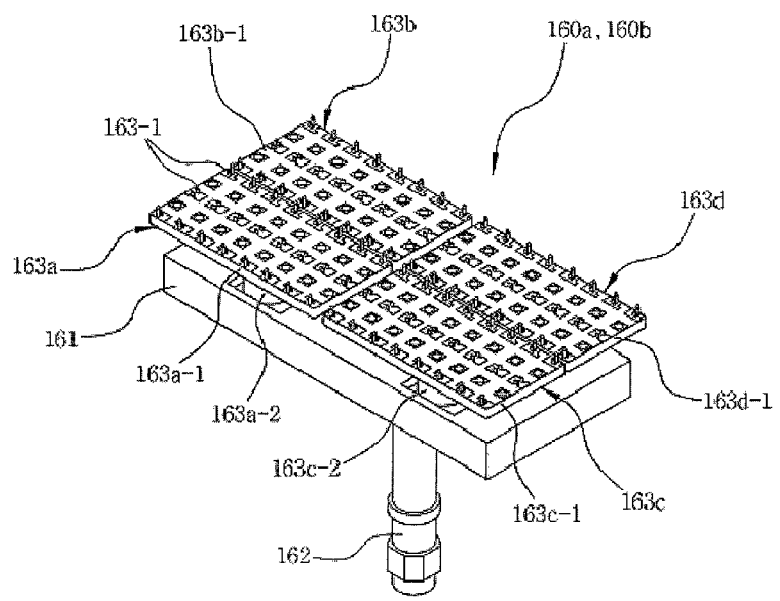
CONVENTIONAL ART

[Fig. 3]
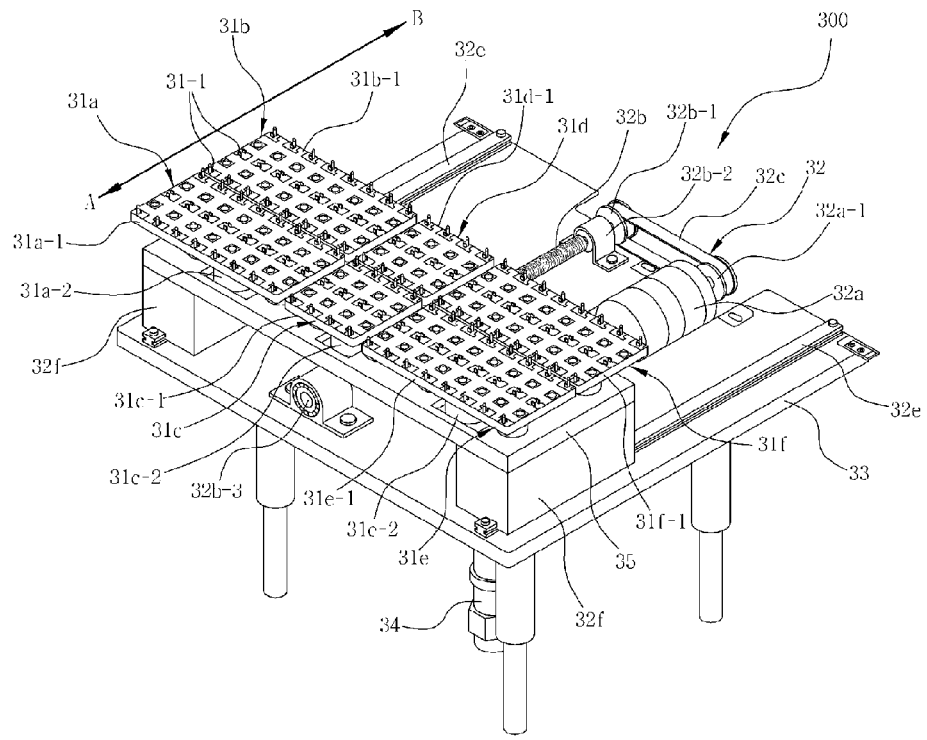
[Fig. 4]
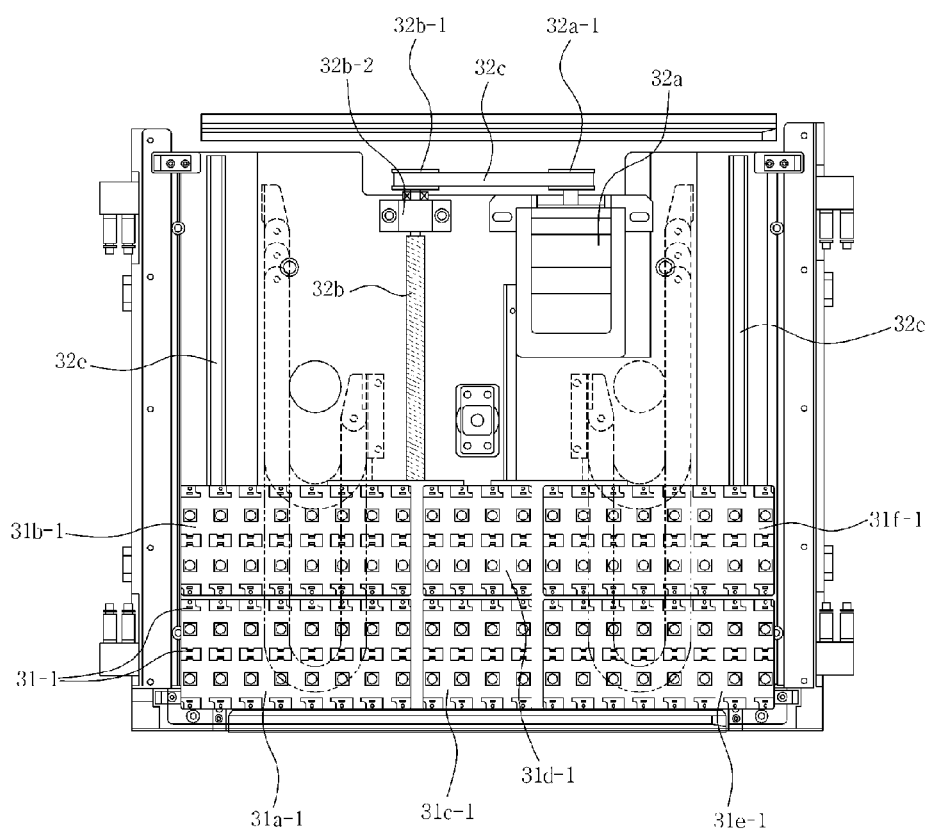

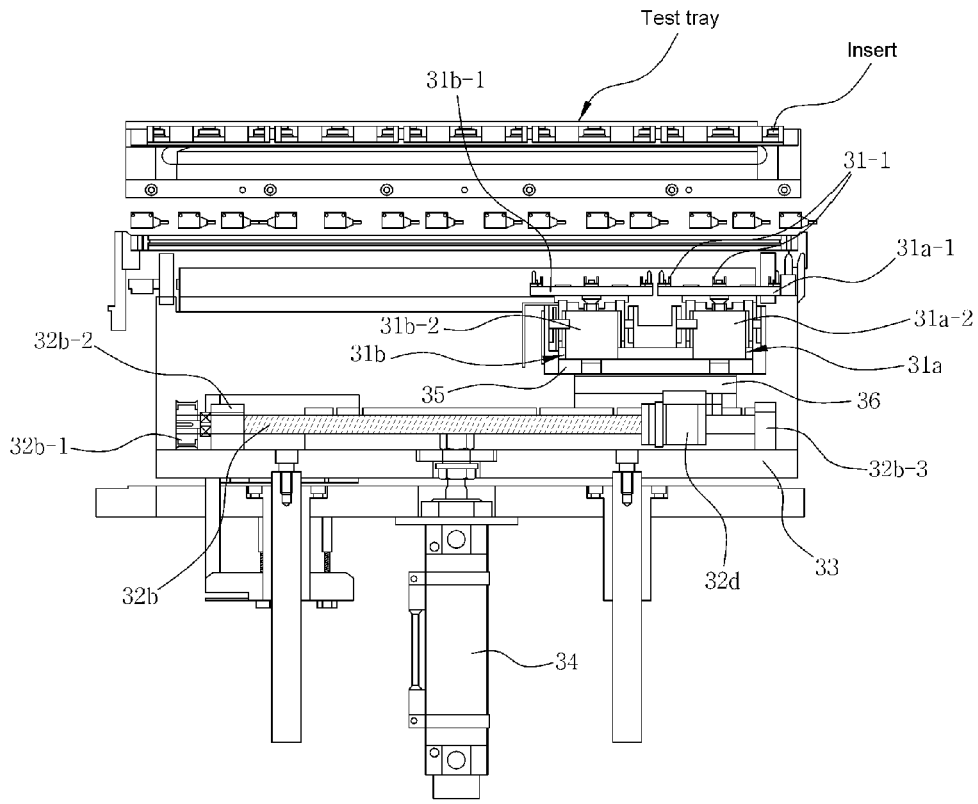
[Fig. 5]
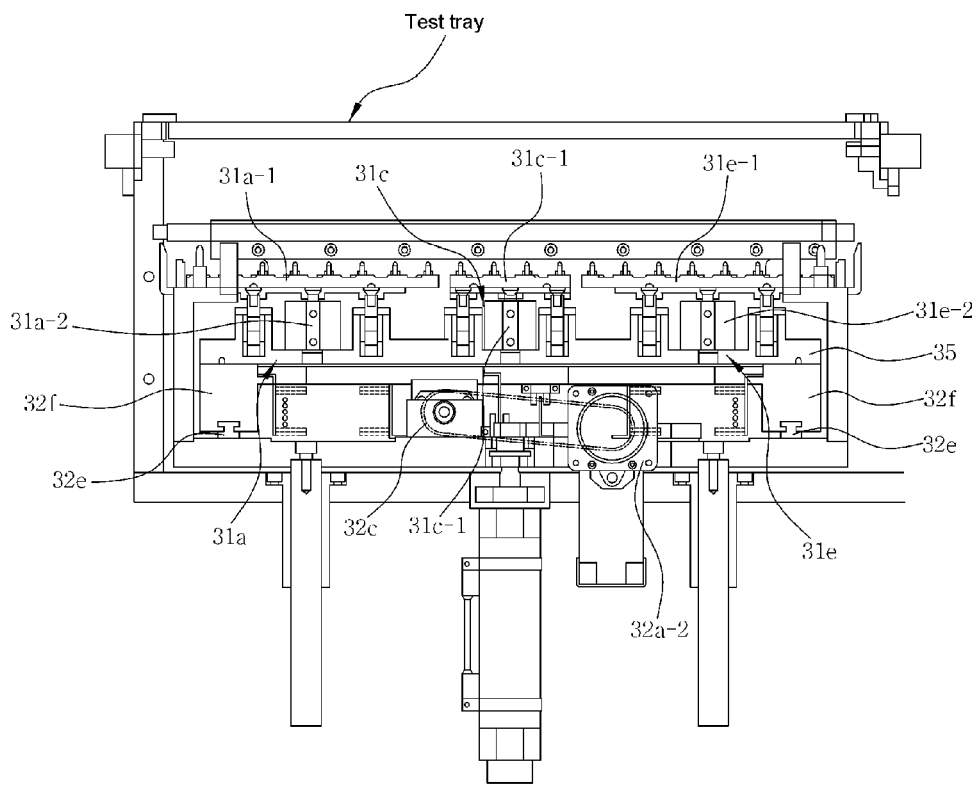
[Fig. 6]

[Fig. 7]
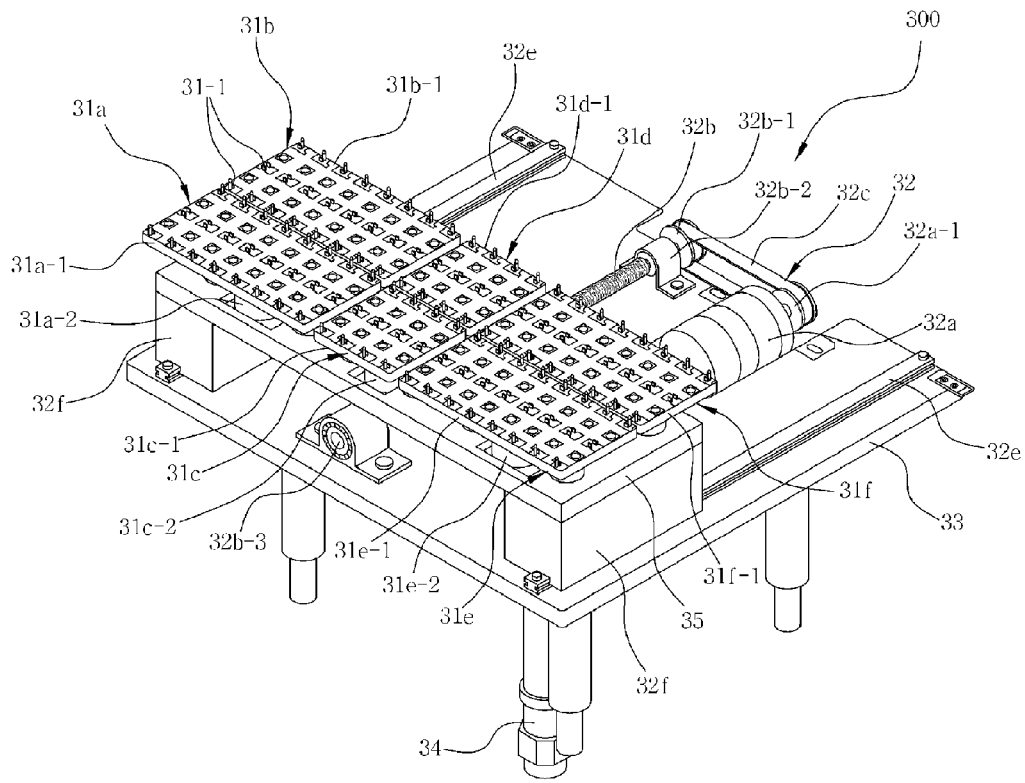
[Fig. 8]
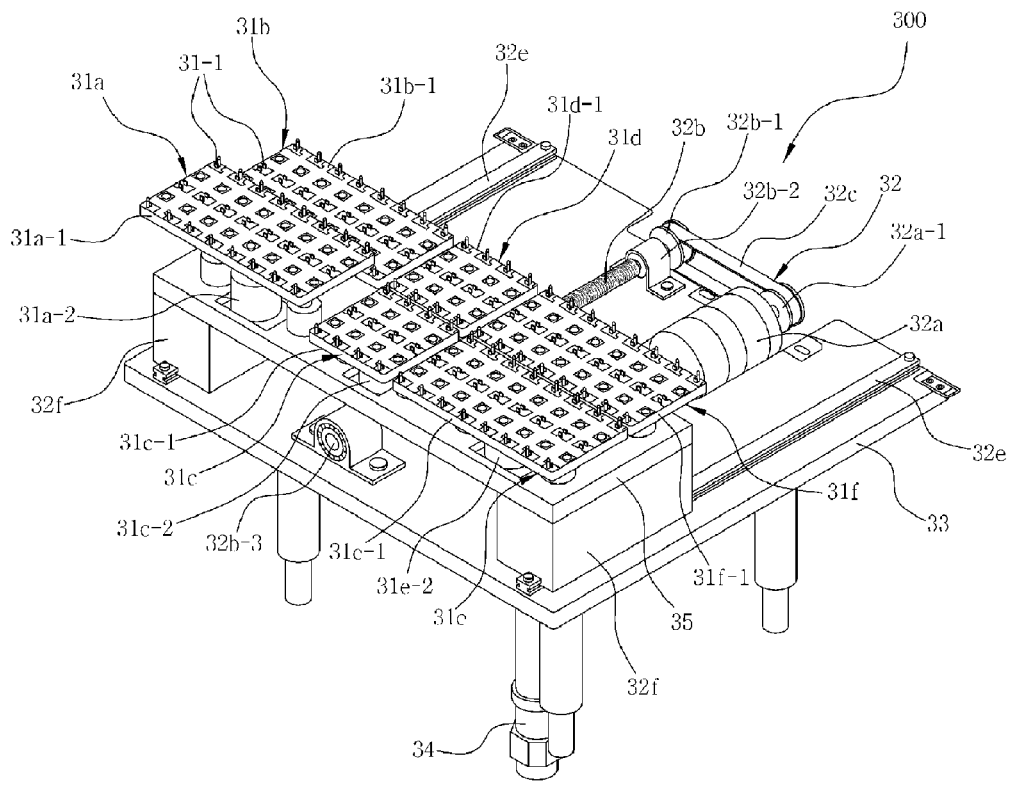

[Fig. 9]
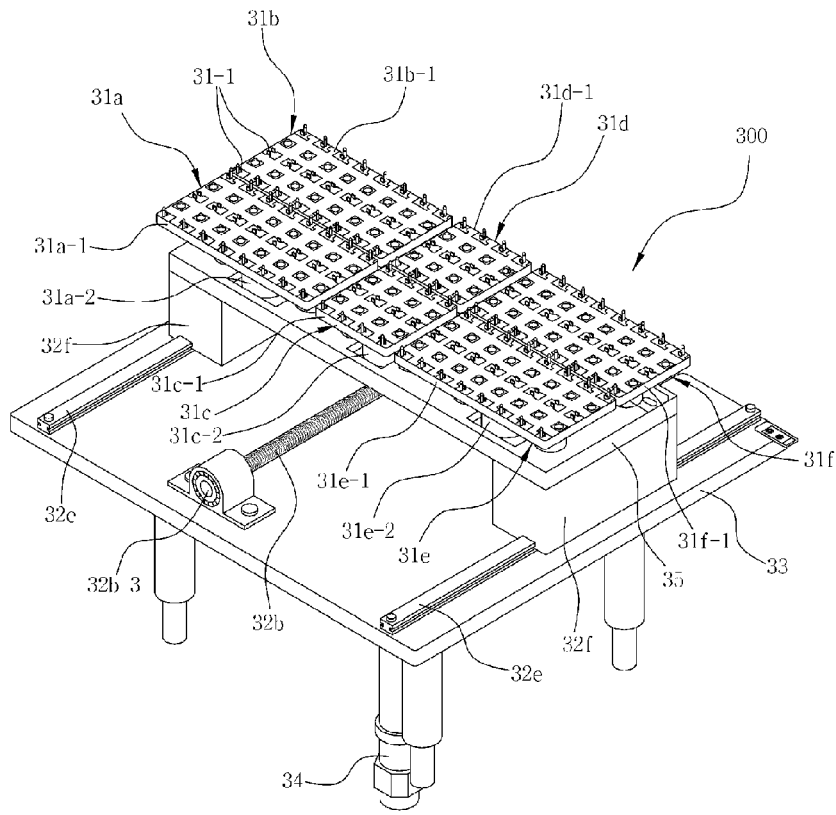
[Fig. 10]
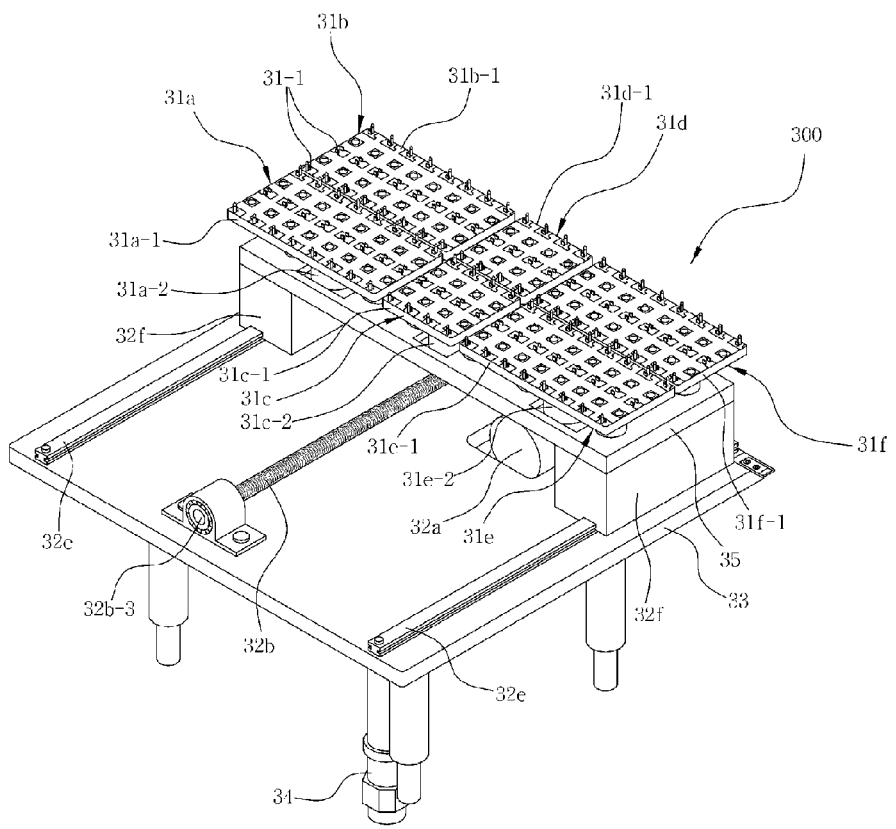

TEST HANDLER AND METHOD FOR OPERATING THE SAME FOR TESTING SEMICONDUCTOR DEVICES

TECHNICAL FIELD

The present invention relates to a test handler, more particularly, to an insert-opening apparatus for opening the inserts of a test tray.

BACKGROUND ART

In general, a test handler is equipment allowing a tester to test semiconductor devices fabricated by a certain fabricating process, sorting the semiconductor devices according to the test result, and loading the semiconductor devices onto user trays. The test handler has been disclosed in many publication documents.

FIG. 1 is a perspective view of a conventional test handler 100. The primary elements of the conventional test handler 100 will now be briefly described.

As shown in FIG. 1, the conventional test handler 100 includes a loading apparatus 110, a soak chamber 120, a test chamber 130, a de-soak chamber 140, an unloading apparatus 150, two insert-opening apparatuses 160a and 160b, and two posture changing apparatuses 170a and 170b. Each element of the test handler 100 will be described in more detail below.

The loading apparatus 110 transfers and loads semiconductor devices loaded onto user trays 10a to a test tray 11a situated at a loading position.

The soak chamber 120 has a temperature environment for pre-heating/pre-cooling the semiconductor devices loaded on the test tray. The soak chamber 120 receives the test tray that is completed the loading of the semiconductor devices by the loading apparatus 110. When the test tray enters the soak chamber 120, it is translated closely to the test chamber 130, maintaining its vertical posture. For translation, the semiconductor devices loaded on the test tray are sufficiently pre-heated/pre-cooled.

The test chamber 130 is installed to the test handler, in which a tester (not shown) tests the semiconductor devices loaded on two test trays 11b and 11c translated from the soak chamber 120. For this, the test chamber 130 has a temperature environment for testing the semiconductor devices.

The de-soak chamber 140 (or a 'restoring chamber') restores the heated or cooled semiconductor devices to a room temperature.

The unloading apparatus 150 sorts the semiconductor devices on the test tray outputted from the de-soak chamber 140, and transfers and unloads the semiconductor devices onto user trays 10b (an unloading step).

Here, the loading apparatus 110 or the unloading apparatus 150 includes at least one pick-and-place apparatus (not shown) for picking up and withdrawing the semiconductor devices loaded on the user tray or the test tray, and for supplying the semiconductor devices to the user tray or the test tray. For example, the pick-and-place apparatus picks up and withdraws the semiconductor devices from the user tray and then supplies them to the test tray in a loading operation. The pick-and-place apparatus picks up and withdraws the semiconductor devices from the test tray and then supplies them to a sorting table (not shown), or supplies them from the sorting table to the user tray, in an unloading operation.

The two insert-opening apparatuses 160a and 160b open inserts arranged in a matrix-form on the test trays 11a and 11b correspondingly situated above their upper sides, respectively, such that the loading apparatus 110 or unloading apparatus 150 can perform loading or unloading, respectively.

The posture changing apparatus 170a changes the horizontal posture of the test tray 11a, on which the semiconductor devices are loaded, into the vertical posture. The posture changing apparatus 170b changes the vertical posture of the test tray translated from the de-soak chamber 140 to the horizontal posture.

The following is a more detailed description of the posture changing of the test tray in the test handler 100.

Firstly, an empty test tray is situated at the underside of the loading apparatus 110, like a test tray 11a. After semiconductor devices are loaded on the empty test tray, the test tray is transferred to the posture changing apparatus 170a sited at the backside of the loading apparatus 110, and then posture-changed. Then, the test tray is transferred to the soak chamber 120. After that, the test tray is translated to the backside of the soak chamber 120 and then enters the test chamber 130. The test tray is horizontally transferred in two rows (or one row), upper and lower, in the test chamber 130. Here, the semiconductor devices on the test tray are tested by a tester (not shown) located at the middle portion of the test chamber 130. After being forwardly translated through the de-soak chamber 140, the test tray of the vertical posture is supplied to the posture changing apparatus 170b located at the backside of the unloading device 150. The posture changing apparatus 170b changes the vertical posture of the test tray to the horizontal posture. The horizontally posture-changed test tray is transferred to the unloading apparatus 150 to unload the semiconductor devices. After loading, the test tray is transferred below the loading apparatus 110. As such, the test tray performs the above-described procedure sequentially to test the semiconductor devices loaded thereon.

After loading the semiconductor devices onto the inserts arrayed in a matrix-form, the test tray is transferred, posture-changed, and tested. To achieve these operations, the inserts must have a mechanical configuration to stably receive the semiconductor devices. Such a configuration was already published in Korean Patent No. 10-0486412, entitled TEST TRAY INSERT OF TEST HANDLER and filed by the applicant of this application (hereinafter, referred to as a 'cited application'). As disclosed in the cited application, the inserts are configured to include a housing for receiving the semiconductor devices, a pair of stoppers for opening the insert as the stoppers rotate to release the insert at both ends of the housing, and a pair of lockers elastically supported by compression springs for preventing rotation of the stoppers and linearly being movable. Therefore, as long as the lockers do not overcome the elastic forces of the compression springs and move linearly to release the stoppers, i.e., as long as the inserts are not opened, the semiconductor devices cannot be received by and separated from the housing.

However, when the loading apparatus 110 performs such a loading, the inserts must be opened to allow the housing to receive the semiconductor devices stably. Also, when the unloading apparatus 150 performs such an unloading, the insert must be opened to separate the semiconductor devices from the housing. Therefore, in order to open the inserts, the two insert-opening apparatuses 160a and 160b, each correspondingly located at the underside of the loading apparatus 110 and unloading apparatus 150, must operate the lockers to release the stoppers, in which the test trays 11a and 11d are each sited between the insert-opening apparatus 160a and the loading apparatus 110 and between the insert-opening apparatus 160b and the unloading apparatus 150.

FIG. 2 is a schematic perspective view illustrating a conventional insert-opening apparatus (160a or 160b).

The conventional insert-opening apparatus (160a or 160b) includes a base plate 161, a base cylinder 162 for linearly transferring the base plate 161 toward a test tray, and four opening units 163a, 163b, 163c and 163d which are mounted on the base plate 161 in a 2×2 matrix-form in the direction of the test tray. The four opening units 163a, 163b, 163c and 163d correspondingly include: plate openers 163a-1, 163b-1, 163c-1, and 163d-1, each of which occupies a quarter of the test tray and arrays a plurality of pairs of opening pins 163-1 in a 2×8 matrix form, which are integrally formed, in which the plate opener 163a-1, for example, opens the inserts in the quarter area allocated thereto simultaneously; and ascending/descending cylinders 163a-2 and 163c-2 for linearly transferring the plate openers 163a-1, 163b-1, 163c-1, and 163d-1 toward the test tray. Here, the plate openers are described as a 'site decision unit' in the cited application. On the other hand, FIG. 2 does not show ascending/descending cylinders for linearly transferring the plate openers 163b-1 and 163d-1.

The following is a description of operations of the conventional insert-opening apparatus 160a and 160b shown in FIG. 2.

Firstly, the base cylinder 162 transfers the base plate 161 closely to the test tray to secure a necessary distance for opening operations of the opening units 163a, 163b, 163c, and 163d. After that, any one of the four opening units 163a, 163b, 163c, and 163d, for example opening unit 163a, operates to open the inserts arrayed in the quarter area corresponding to the opening unit 163a. For example, when the ascending/descending cylinder 163a-2 transfers the plate opener 163a-1 toward the test tray, the pairs of opening pins 163-1 of the plate opener 163a-1 push and linearly transfer pairs of lockers mounted in each inserts to rotate pairs of stoppers, thereby opening the insert.

As such, each of the four opening units 163a, 163b, 163c, and 163d opens 16 inserts arrayed in ¼ area of the test tray, respectively, such that all inserts arrayed in all area of test tray can be opened. More specifically, the four opening units 163a, 163b, 163c, and 163d operate sequentially as follows: for example, the opening unit 163a opens the inserts arrayed in a quarter area of the test tray allocated thereto, and closes the inserts after the semiconductor devices are loaded in or separated from the opened inserts; and then, the opening unit 163b opens the inserts arrayed in another quarter area of the test tray allocated thereto, and so on.

As such, the opening units 163a, 163b, 163c, and 163d are sequentially operated so as not to apply a relatively large force to the test tray, which may cause the test tray to bend. More specifically, when the four opening units are operated simultaneously, a relatively large force may be applied to the test tray, and when such a large force-applying state is maintained for a long time, the test tray may bend. Meanwhile, a pick-and-place apparatus including the loading apparatus 110 and unloading apparatus 150 should be configured to be light for rapid processing and response speed. Thus, the pick-and-place apparatus is generally configured to pick up and transfer no more than 16 semiconductor devices. Therefore, since it is enough that the inserts are opened in concert with a one-time processing capacity of the pick-and-place apparatus, only the number of inserts corresponding to the one-time processing capacity is sequentially opened. Thus, the force applied to the test tray can be minimized to prevent the test tray from bending.

On the other hand, test handlers tend to be developed to test more number of semiconductor devices at one time. Presently, a test tray arraying 32 or 64 inserts is commonly used, but, recently, a large-sized test tray having 128 or 160 inserts has been developed and will be sold on the market.

However, due to a structural restriction, the pick-and-place apparatus still only has the capacity to test a maximum of 16 inserts. Therefore, in the case when a large-sized test tray is used, where 8 or 10 opening units should be installed, the production cost of the test handler would be increased.

Also, when the type of semiconductor devices to be tested is changed or a new type of tester is applied to the test handler, the test tray must be replaced. In this case, additional work should be done, such as adjusting the distance between a pair of opening pins. Therefore, all of the opening units, etc., should be replaced, respectively. When 8 or 10 opening units are installed on a large-sized test tray, such replacement work requires a lot of time and increased replacement costs, and causes a waste of resources.

DISCLOSURE OF INVENTION

Technical Problem

Therefore, the present invention has been made in view of the above problems, and it is an object of the present invention to provide a test handler which is operable in such a way that it opens inserts arrayed in one part of a test tray and then moves to another part of the test tray and opens inserts arrayed there.

Technical Solution

In accordance with the present invention, the above object can be accomplished by the provision of a test handler comprising: a test tray, on one side of which a plurality of inserts are arrayed, here, each insert can be loaded at least one semiconductor device thereon; at least one opening unit for opening inserts at one part of the one side of the test tray; and a position changing apparatus for moving at least one opening unit in such a way that the at least one opening unit can be located at another part of the one side of the test tray, such that the at least one opening unit can open inserts at said another part of the one side of the test tray.

Preferably, the test handler may further comprise: a pick-and-place apparatus for loading the semiconductor devices on the test tray or picking up the semiconductor devices from the test tray. Here, the position changing apparatus moves the at least one opening unit independently of the pick-and-place apparatus.

Preferably, the semiconductor device is loaded on or picked up from the test tray of a horizontal posture. Also, the at least one opening unit is horizontally moved.

Preferably, the opening unit may include: a opener for contacting and opening the inserts at the one part of the one side of the test tray; and a linear moving apparatus for moving the opener toward the inserts such that the opener can contact the inserts.

Preferably, the linear moving apparatus is a cylinder.

Preferably, the position changing apparatus may include: a driving source for generating driving force necessary for movement of the at least one opening unit; and a driving force transferring apparatus for transferring the driving force from the driving source to the opening unit.

Preferably, the driving source is a motor.

Preferably, the driving source transferring apparatus may include: a threaded shaft, being rotated forward or backward according to operation of the motor; and an internally threaded nut, being received the threaded shaft, being moved linearly along the axis of the threaded shaft according to the rotation of the threaded shaft, and being coupled to the opening unit.

Preferably, the opening unit is integrated into a module which is detachably coupled to the driving force transferring apparatus.

Preferably, the test handler may further comprise: a base plate for supporting the opening unit through the position changing apparatus, in which the position changing apparatus is installed on the base plate; and a driver for linearly moving the base plate toward the test tray to selectively secure a distance necessary for an opening operation of the opening unit.

Preferably, the driver is a cylinder.

ADVANTAGEOUS EFFECTS

As described above, the insert-opening apparatus according to the present invention is operated in such a way that: while at least one opening unit, which corresponds to a part of inserts aligned on a test tray, is sequentially moved, all the inserts of the test tray are processed by the opening units. Therefore, the present invention can reduce the number of fittings and thus decrease production cost. Also, the present invention can reduce maintenance costs due to replacement work. In addition, since a plurality of opening units are integrated into a module through an installation plate, such that the module can be detachably coupled to guide blocks and coupling blocks, replacement of a test tray can be easily performed, thereby reducing replacement work time. Furthermore the present invention can be conveniently applied to various types of testers.

BRIEF DESCRIPTION OF THE DRAWINGS

The above object, features and other advantages of the present invention will be more clearly understood from the following detailed description taken in conjunction with the accompanying drawings, in which:

FIG. 1 is a perspective view of a conventional test handler;

FIG. 2 is a perspective view of an insert-opening apparatus applied to the conventional test handler of FIG. 1;

FIG. 3 is a perspective view of an insert-opening apparatus according to an embodiment of the present invention;

FIG. 4 is a top view of the insert-opening apparatus of FIG. 3;

FIG. 5 is a left side view of the insert-opening apparatus of FIG. 3;

FIG. 6 is a front view of the insert-opening apparatus of FIG. 3; and

FIGS. 7 to 10 are perspective views for describing operation states of the insert-opening apparatus of FIG. 3.

BRIEF DESCRIPTION OF SYMBOLS IN THE DRAWINGS

300: insert-opening apparatus
31a, 31b, 31c, 31d, 31e, 31f: opening unit
31a-1, 31b-1, 31c-1, 31d-1, 31e-1, 31f-1: opener
31a-2, 31b-2, 31c-2, 31d-2, 31e-2, 31f-2: ascending/descending cylinder
31-1: a pair of opening pins
32: position changing apparatus
32a: motor
32b: threaded shaft
32c: rotation belt
32d: internally threaded nut
33: base plate
34: base cylinder
35: installation plate
36: coupling block

BEST MODE FOR CARRYING OUT THE INVENTION

With reference to the drawings, a preferred embodiment of the insert-opening apparatus (hereinafter referred to as an opening apparatus) of a test handler, according to the present invention, will be described in detail below.

FIG. 3 is a perspective view of an opening apparatus 300 according to an embodiment of the present invention. FIG. 4 is a top view of the opening apparatus 300 of FIG. 3. FIG. 5 is a left side view of the opening apparatus 300 of FIG. 3. FIG. 6 is a front view of the opening apparatus 300 of FIG. 3.

Referring to FIG. 3, the opening apparatus 300 is configured to include: 6 opening units 31a, 31b, 31c, 31d, 31e, and 31f; a position changing apparatus 32, a base plate 33, a base cylinder 34, an installation plate 35, and a coupling block 36 as shown in FIG. 5.

The 6 opening units 31a, 31b, 31c, 31d, 31e, and 31f serve to open inserts aligned on parts of area of a test tray, respectively. The 6 opening units include: openers 31a-1, 31b-1, 31c-1, 31d-1, 31e-1, and 31f-1; and ascending/descending cylinders 31a-2, 31c-2, 31e-2, correspondingly.

The openers 31a-1, 31b-1, 31c-1, 31d-1, 31e-1, and 31f-1 linearly move toward the test tray. The openers 31a-1, 31b-1, 31c-1, 31d-1, 31e-1, and 31f-1 include pairs of opening pins 31-1 for opening the inserts by linearly moving pairs of lockers of inserts on their surfaces facing the test tray. Here, as shown in FIGS. 3 and 4, each of the openers 31a-1, 31b-1, 31e-1 and 31f-1 includes 16 pairs of opening pins 31-1 to open 16 inserts. Also, both the openers 31c-1 and 31d-1 include 8 pairs of opening pins 31-1 to open 8 inserts.

The ascending/descending cylinders 31a-2, 31c-2, and 31e-2 are installed onto the upper surface of the installation plate 35 and moved together with the installation plate 35. The ascending/descending cylinders 31a-2, 31c-2, and 31e-2 enable the respective openers 31a-1, 31c-1, and 31e-1 to move linearly toward the test tray. Here, the ascending/descending cylinders which enable the respective openers 31b-1, 31d-1, and 31f-1 to move linearly toward the test tray are not exposed in FIG. 3.

The position changing apparatus 32 is configured to move the 6 opening units 31a, 31b, 31c, 31d, 31e, and 31f along the contact surface of the test tray (refer to the arrow direction AB in FIG. 3) and thus to change their positions. The position changing apparatus 32 includes a motor 32a having a driving pulley 32a-1, a threaded shaft 32b having a driven pulley 32b-1, a rotating belt 32c, a internally threaded nut 32d as shown in FIG. 5, a pair of guide rails 32e, and a pair of guide blocks 32f, etc.

The motor 32a is fixedly mounted on a base plate 33 by motor brackets 32a-2, as shown in FIG. 6. The motor 32a functions as a driving source for supplying driving force such that the opening units 31a, 31b, 31c, 31d, 31e, and 31f can move along the surface of the test tray facing the opening units (refer to the arrow direction AB in FIG. 3). Therefore the motor 32a can be rotated forward and backward. Preferably, the motor 32a is implemented with a step motor or a servo motor to easily control the positions of the opening units 31a, 31b, 31c, 31d, 31e, and 31f.

The threaded shaft 32b is rotated by the motor 32a. The threaded shaft 32b is aligned to be parallel to the moving direction of the 6 opening units 31a, 31b, 31c, 31d, 31e, and 31f. The threaded shaft 32a is rotatably fixed to the base plate 33 through bearing blocks 32b-2 and 32b-3 located at both ends thereof.

The rotating belt 32c is configured to transfer a rotational force of the motor 32a from the driving pulley 32a-1 to the driven pulley 32b-1.

The internally threaded nut 32d is received the threaded shaft 32b and, and at the same time, is coupled to the installation plate 35 through the coupling block 36, such that the opening units 31a, 31b, 31c, 31d, 31e, and 31f can move straight along the surface of the test tray facing the opening units when the threaded shaft 32b is rotated. That is, the internally threaded nut 32d functions as an apparatus transforming a rotation motion of the threaded shaft 32b to a linear motion. Therefore, the threaded shaft 32b, rotational belt 32c, and internally threaded nut 32d function together as a driving force transferring apparatus that transforms a rotational motion of the motor 32a to a linear motion and transfers it to the opening units 31a, 31b, 31c, 31d, 31e, and 31f.

The pair of guide rails 32e is mounted onto both end portions of the base plate 33 in such a way that their rails are parallel to the moving direction of the opening units 31a, 31b, 31c, 31d, 31e, and 31f.

The pair of guide blocks 32f is slidably coupled, in their lower portions, onto the pair of guide rails 32e, respectively. Also, the pair of guide blocks 32f is coupled, in their upper portions, to the installation plate 35.

Here, although the position changing apparatus 32 according to the present invention is implemented in such a way that the motor transfers its rotation motion to the threaded shaft using a rotational belt to change the position of the opening units, it will be appreciated to the skilled person in the art that it can be variously modified such that the motor can directly rotate the threaded shaft or the motor without the rotational belt, and, other parts associated with therewith can be replaced with a cylinder as a driving source, etc.

The base plate 33 serves to support the above-described elements and allows them to be linearly moved toward the test tray. Specifically, the motor 32a, threaded shaft 32b, guide rails 32e, etc., are mounted on the base plate 33. The base plate 33 supports the installation plate 35 through the guide blocks 32f and coupling blocks 36, thereby supporting the opening units 31a, 31b, 31c, 31d, 31e, and 31f installed on the installation plate 35.

The base cylinder 34 serves to lift the base plate 33 up or down to selectively secure an operation distance that is necessary for the opening units 31a, 31b, 31c, 31d, 31e, and 31f to open inserts of a test tray.

Also, the installation plate 35 is formed as a plate shape, on whose upper side the ascending/descending cylinders 31a-2, 31c-2, and 31e-2 are fixedly installed in a 2×3 matrix-form, and onto whose lower side the guide blocks 32f and the coupling blocks 36 are detachably coupled. That is, since the opening units 31a, 31b, 31c, 31d, 31e, and 31f are integrated into a module through the installation plate 35, when the installation plate 35 is moved or separated from the guide blocks 32f and the coupling blocks 36, the opening units 31a, 31b, 31c, 31d, 31e, and 31f are also moved or separated together with the installation plate 35.

The coupling blocks 36 is configured to couple the internally threaded nuts 32d to the installation plate 35.

Therefore, when the motor 32a rotates, the threaded shaft 32b is rotated, which enables the internally threaded nut 32d to move linearly. Then, the installation plate 35 coupled to the internally threaded nut 32d through the coupling blocks 36 is also moved. Therefore, the 6 opening units 31a, 31b, 31c, 31d, 31e, and 31f on the installation plate 35 are moved as well.

The following is a description of the operation of the opening apparatus according to the present invention, with reference to FIGS. 3, 7, 8, 9, and 10.

Firstly, a test tray (not shown) is transferred and located above the opening units 31a, 31b, 31c, 31d, 31e, and 31f as shown in FIG. 3. Then, the base cylinder 34 lifts the base plate 33 up at a certain height to secure a distance that is necessary for the opening units 31a, 31b, 31c, 31d, 31e, and 31f to perform an opening operation, as shown in FIG. 7. As a result, as shown in FIG. 7, the position changing apparatus 32 and the installation plate 35, which are mounted on the base plate 33, are also lifted up together with the base plate 33 to that certain height, and the opening units 31a, 31b, 31c, 31d, 31e, and 31f installed on the installation plate 35 are also lifted up to the same height.

After that, as shown in FIG. 8, the opening unit 31a is operated in such a way that: when the ascending/descending cylinder 31a-2 lifts the opener 31a-1 up toward the test tray, 16 pairs of opening pins of the opener 31a-1 lift up the locker pairs of the corresponding inserts, and thus the inserts are opened. At this state, a pick-and-place apparatus provides 16 semiconductor devices held thereby to the opened 16 inserts, which is called a loading. (On the other hand, the pick-and-place apparatus perform an unloading by picking up the 16 semiconductor devices loaded on the inserts.) After completing the loading, the ascending/descending cylinder 31a-2 lowers the opener 31a-1, and thus the inserts are closed.

After that, like the operation associated with the opening unit 31a, the opening unit 31b is operated in such a way that: the ascending/descending cylinder 31b-2 (not shown) lifts up the opener 31b-1; and the opener 31b-1 can open the inserts.

In the same way, the rest of the opening units 31c, 31d, 31e, and 31f are operated to open corresponding inserts.

After the operation of the opening units 31a, 31b, 31c, 31d, 31e, and 31f is completed, the motor 32a is operated to rotate the threaded shaft 32b. According to the rotation of the threaded shaft 32b, the installation plate 35 is moved horizontally along the arrow direction B shown in FIG. 3 at a certain distance, under the test tray in a horizontal state, and located at the position as shown in FIG. 9.

In the state shown in FIG. 9, the opening units 31a, 31b, 31c, 31d, 31e, and 31f are sequentially operated in such a way to open corresponding inserts and then close them, in the same fashion as the previously described operation thereof. When all the opening units 31a, 31b, 31c, 31d, 31e, and 31f finish their operations in the state of FIG. 9, the motor 32a is operated to locate the installation plate 35 at a position as shown in FIG. 10.

In the state shown in FIG. 10, only the opening units 31b, 31d, and 31f are sequentially operated to perform an operation for the rest of the inserts that do not complete their operations.

Therefore, the opening operations for all the inserts of on the test tray are sequentially performed.

When all the operations in the state shown in FIG. 10 are completed, the motor 32a is rotated backward and the base cylinder 34 is operated to lower the base plate 33 by the previously lifted height, thereby restoring the inserting-opening apparatus to the state shown in FIG. 3.

As well, when the present test tray should be replaced with another one because the size of semiconductor devices to be tested is different from that of given semiconductor devices, the insert-opening apparatus according to the present invention simplifies a replacement work in such a way that the installation plate 35 is separated from the guide blocks 32f and the coupling blocks 36, and then another installation plate, having opening units corresponding to the replaced test tray, is re-installed to the guide blocks 32f and the coupling blocks 36.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

The test handler according to the present invention can be applied to the systems that test fabricated semiconductor devices.

The invention claimed is:

1. A test handler comprising:
a test tray having a plurality of inserts arrayed therein, each insert having at least one semiconductor device loaded therein;
an opening apparatus provided for opening the inserts arrayed in the test tray; and
a pick-and-place apparatus loading the at least one semiconductor device to the test tray or picking up the at least one semiconductor device from the test tray when the inserts are opened by the opening apparatus,
wherein the opening apparatus includes:
at least one opening unit disposed under the test tray, provided to be movable in a horizontal direction, and opening inserts arrayed in one part of the test tray;
a position changing apparatus moving the at least one opening unit in the horizontal direction so as to position the at least one opening unit in another part of the test tray such that the at least one opening unit opens inserts arrayed in the other part of the test tray.
a base plate provided to be ascendable and descendible and having the position changing apparatus installed thereon;
a base cylinder causing the base plate to ascend and descend; and
an installation plate having the at least one opening unit installed thereon and provided to be moveable in the horizontal direction with respect to the base plate such that a position thereof is changed using the position changing apparatus,
wherein the at least one opening unit includes:
an opener provided to be ascendable and descendible and having pairs of opening pins causing the inserts to be open during ascending and causing the inserts to be closed during descending; and
an ascending/descending cylinder installed on the installation plate and causing the opener to ascend and descend,
wherein a total number of the pairs of opening pins of the opening apparatus is less than that of the inserts of the test tray.

2. The test handler according to claim 1, wherein the position changing apparatus includes:
a driving source for generating driving force necessary for movement of the at least one opening unit; and
a driving force transferring apparatus for transferring the driving force from the driving source to the opening unit
wherein the driving source comprises the motor, and
wherein the driving force transferring apparatus includes a threaded shaft rotating at least one of forwards and backwards according to operation of the motor and an internally threaded nut receiving the threaded shaft, moving linearly along the axis of the threaded shaft according to the rotation of the threaded shaft, and coupling to the opening unit.

3. The test handler according to claim 2, wherein the opening unit is integrated into a module which is detachably coupled to the driving force transferring apparatus.

* * * * *